United States Patent
Hotta et al.

(10) Patent No.: US 11,431,254 B2
(45) Date of Patent: Aug. 30, 2022

(54) SWITCHING ELEMENT UNIT AND SWITCHING ELEMENT MODULE FOR USE IN AN INVERTER CIRCUIT

(71) Applicant: AISIN CORPORATION, Kariya (JP)

(72) Inventors: Yutaka Hotta, Chiryu (JP); Shinya Osuka, Nishio (JP); Yasuhiro Kume, Takahama (JP); Kaoru Shimano, Anjo (JP); Toshiyuki Fukuhara, Nagoya (JP); Takeshi Ikeyama, Nagoya (JP)

(73) Assignee: AISIN CORPORATION, Kariya (JP)

( * ) Notice: Subject to any disclaimer, the term of this patent is extended or adjusted under 35 U.S.C. 154(b) by 0 days.

(21) Appl. No.: 15/734,603

(22) PCT Filed: Jun. 24, 2019

(86) PCT No.: PCT/JP2019/024956
§ 371 (c)(1),
(2) Date: Dec. 3, 2020

(87) PCT Pub. No.: WO2020/012936
PCT Pub. Date: Jan. 16, 2020

(65) Prior Publication Data
US 2021/0234467 A1    Jul. 29, 2021

(30) Foreign Application Priority Data

Jul. 9, 2018    (JP) .............................. JP2018-129882

(51) Int. Cl.
*H01L 23/367*    (2006.01)
*H02M 7/00*    (2006.01)
(Continued)

(52) U.S. Cl.
CPC .......... *H02M 7/003* (2013.01); *H01L 23/367* (2013.01); *H01L 23/492* (2013.01); *H02M 7/5387* (2013.01)

(58) Field of Classification Search
CPC .... H02M 7/003; H02M 7/5387; H02M 1/008; H01L 23/367; H01L 23/492; H01L 23/36; H01L 25/072; H01L 25/16; H01L 25/18
See application file for complete search history.

(56) References Cited

U.S. PATENT DOCUMENTS

| 8,237,232 B2* | 8/2012 | Uno ....................... H01L 24/41 |
| | | 257/401 |
| 10,840,172 B2* | 11/2020 | Bemmerl .......... H01L 23/49503 |

(Continued)

FOREIGN PATENT DOCUMENTS

| JP | 2002-369496 A | 12/2002 |
| JP | 2007-236105 A | 9/2007 |
| JP | 2007-336643 A | 12/2007 |

OTHER PUBLICATIONS

May 31, 2021 Extended European Search Report issued in European Patent Application No. 19834960.7.

(Continued)

*Primary Examiner* — Thienvu V Tran
*Assistant Examiner* — Shahzeb K Ahmad
(74) *Attorney, Agent, or Firm* — Oliff PLC

(57) ABSTRACT

A first switching element and a second switching element are arranged side by side in a first direction. An output bus bar is disposed to extend in the first direction. The first switching element and the second switching element are disposed to be embedded in a molded portion. The output bus bar includes an embedded portion embedded in the molded portion, a first exposed portion exposed from the molded portion on one side of the switching element set in the first direction, and a second exposed portion exposed from the molded portion on another side of the switching element set in the first direction.

8 Claims, 5 Drawing Sheets

(51) Int. Cl.
*H01L 23/492* (2006.01)
*H02M 7/5387* (2007.01)

(56) References Cited

U.S. PATENT DOCUMENTS

| | | | | |
|---|---|---|---|---|
| 2005/0161785 | A1* | 7/2005 | Kawashima | H01L 24/73 257/678 |
| 2015/0287665 | A1* | 10/2015 | Hanada | H01L 23/49811 257/691 |
| 2016/0016475 | A1* | 1/2016 | Toda | H01L 23/467 318/400.26 |
| 2018/0033720 | A1* | 2/2018 | Tsukamoto | H02M 3/155 |

OTHER PUBLICATIONS

Aug. 13, 2019 International Search Report issued in International Patent Application No. PCT/JP2019/024956.

\* cited by examiner

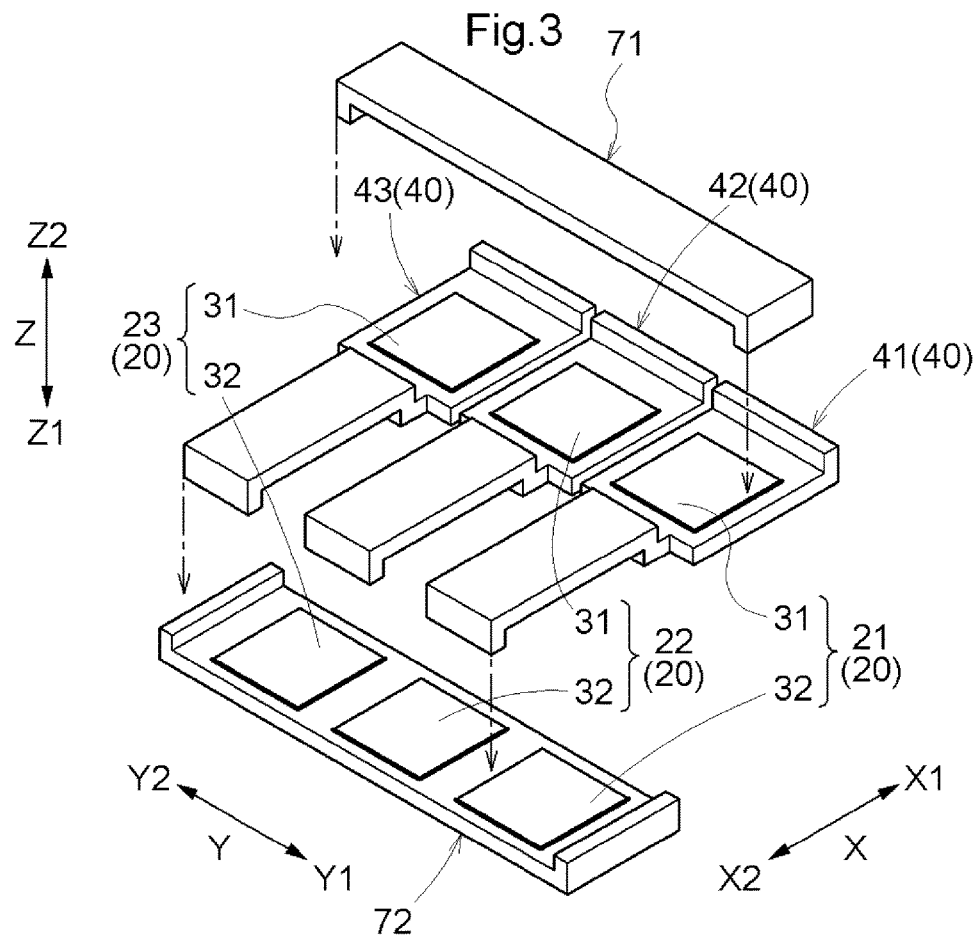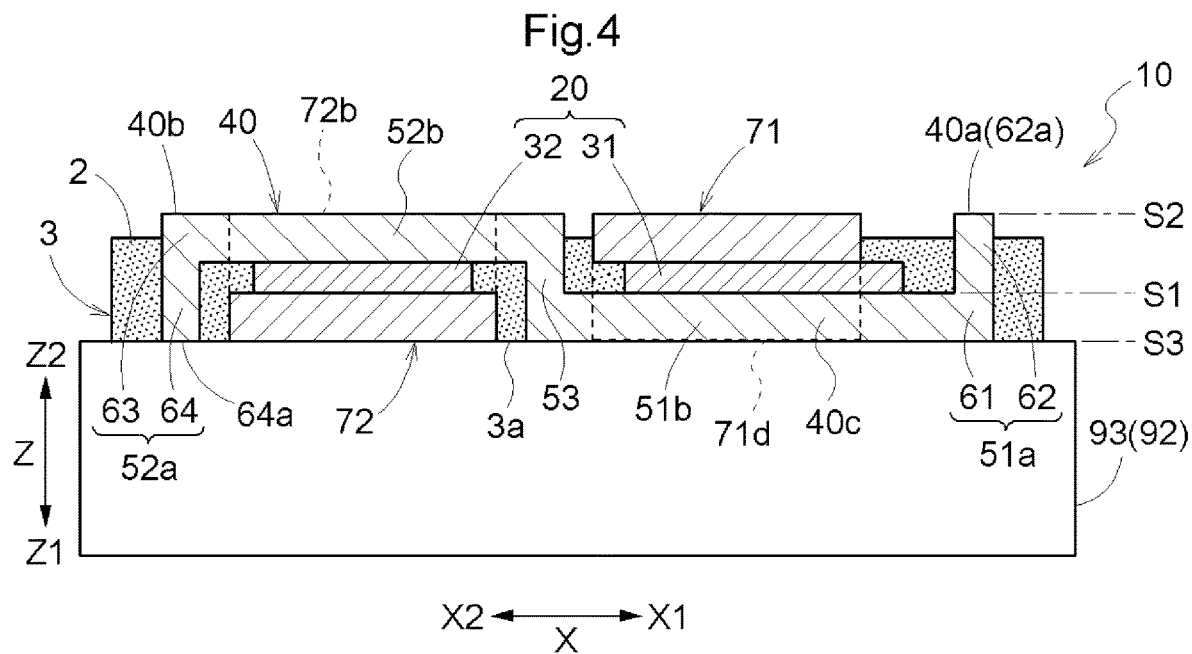

SWITCHING ELEMENT UNIT AND SWITCHING ELEMENT MODULE FOR USE IN AN INVERTER CIRCUIT

TECHNICAL FIELD

The present disclosure relates to a switching element unit including a switching element set that forms an inverter circuit, and a switching element module including plural of the switching element units.

BACKGROUND ART

An example of the switching element unit described above is disclosed in Japanese Patent Application Publication No. 2002-369496 (Patent Document 1). Patent Document 1 discloses a technique for preventing erroneous overcurrent detection and heat concentration due to imbalance at the time of switching a power element when intelligent power modules (IPM) for forming an inverter circuit are connected in parallel and used. Although not explicitly described in Patent Document 1, since the IPMs are connected in parallel, it is possible to increase the current capacity of the entire inverter circuit, and to drive a large-capacity AC device.

If the current capacity of an entire switching element module including a plurality of switching element units is configured to be variable by changing the number of switching element units to be connected in parallel, it is preferable that the electrical connection structure for electrically connecting switching elements included in different switching element units in parallel to each other is simple, from the view point of cost reduction and size reduction of the arrangement space. However, Patent Document 1 does not specifically disclose such an electrical connection structure.

RELATED ART DOCUMENTS

Patent Documents

Patent Document 1: Japanese Unexamined Patent Application Publication No. 2002-369496

SUMMARY OF THE DISCLOSURE

Problem to be Solved by the Disclosure

Accordingly, it is desired to provide a technique that can, when connecting a plurality of switching element units in parallel, simplify the electrical connection structure for electrically connecting switching elements included in different switching element units in parallel to each other.

Means for Solving the Problem

A switching element unit according to the present disclosure includes: a switching element set that forms an inverter circuit; a first bus bar connected to one of a positive electrode and a negative electrode of a DC power supply; a second bus bar connected to another of the positive electrode and the negative electrode of the DC power supply; an output bus bar connected to an AC device; and a molded portion; wherein the switching element set includes a first switching element connected to the first bus bar and the output bus bar, and a second switching element connected to the second bus bar and the output bus bar; wherein the first switching element and the second switching element are arranged side by side in a first direction; wherein the output bus bar is disposed to extend in the first direction while being in contact with a surface of the first switching element opposite to a surface in contact with the first bus bar, and being in contact with a surface of the second switching element opposite to a surface in contact with the second bus bar; wherein the first switching element and the second switching element are disposed to be embedded in the molded portion; and wherein the output bus bar includes an embedded portion embedded in the molded portion, a first exposed portion exposed from the molded portion on one side of the switching element set in the first direction, and a second exposed portion exposed from the molded portion on another side of the switching element set in the first direction.

When connecting a plurality of switching element units having this configuration in parallel, switching elements included in different switching element units can be electrically connected in parallel to each other by connecting output bus bars included in the different switching element units to each other, first bus bars to each other, and second bus bars to each other. According to the above configuration, the output bus bar includes the exposed portions exposed from the molded portion, on both sides of the switching element set in the first direction. Accordingly, a plurality of switching element units to be connected are arranged side by side in the same orientation in the first direction, thereby making it possible to simplify the electrical connection structure for connecting the output bus bars to each other. Specifically, the first exposed portion of the output bus bar of one switching element unit of two switching element units adjacent in the first direction and the second exposed portion of the output bus bar of the other switching element unit are connected, so that the output bus bars can be connected to each other without interposing any of the switching element sets of the two switching element units. This makes it possible to simplify the electrical connection structure for connecting the output bus bars to each other.

When arranging the plurality of switching element units side by side in the first direction and connecting the output bus bars of two adjacent switching element units to each other in the manner described above, the output bus bar of either one of the switching element units is connected to the AC device. Thus, all the output bus bars of the plurality of switching element units can be electrically connected to the AC device. In this case, of the exposed portions of the output bus bar of the switching element unit disposed at the end in the first direction, the exposed portion not connected to the output bus bar of another switching element unit adjacent in the first direction is connected to the AC device. Thus, it is possible to provide an electrical connection structure between the switching element unit and the AC device, while avoiding interference with the electrical connection structure for connecting the output bus bars to each other.

As described above, according to the above configuration, when connecting a plurality of switching element units in parallel, it is possible to simplify the electrical connection structure for electrically connecting switching elements included in different switching element units in parallel to each other.

Other features and advantages of the switching element unit will become apparent from the following description of the embodiments with reference to the accompanying drawings.

BRIEF DESCRIPTION OF THE DRAWINGS

FIG. 3 is an exploded perspective view illustrating a part of the molded unit according to the embodiment.

FIG. 4 is a cross-sectional view illustrating the molded unit according to the embodiment.

MODES FOR CARRYING OUT THE DISCLOSURE

Figure 1:
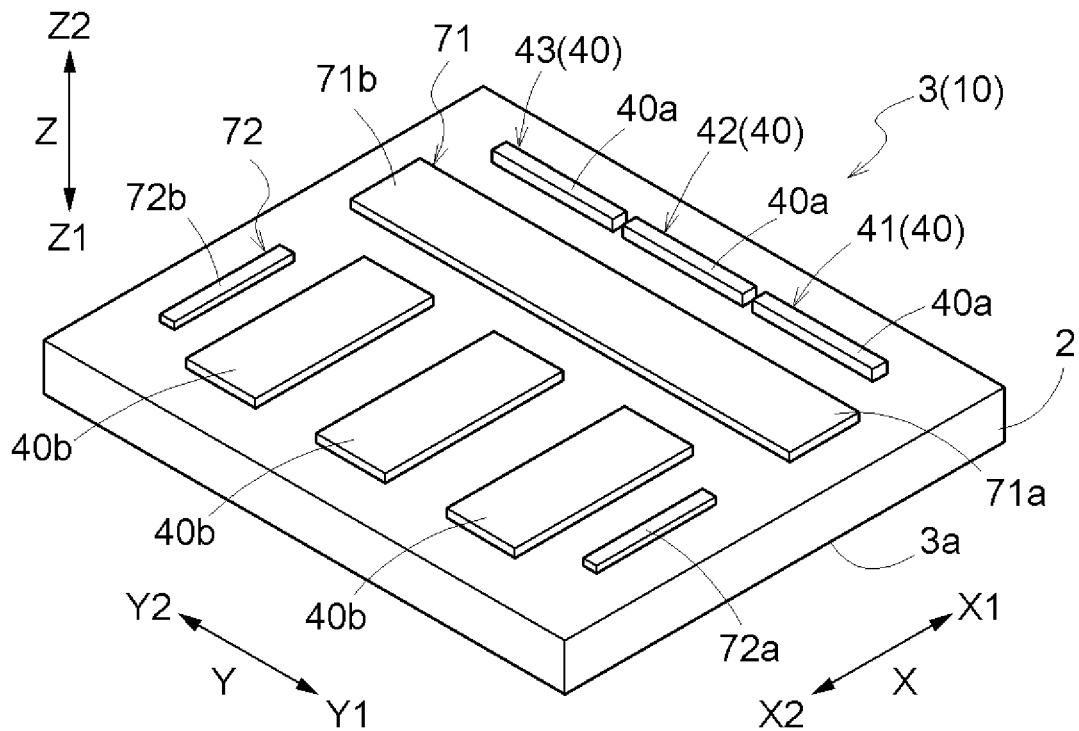
FIG. 1 is a perspective view illustrating a molded unit according to an embodiment.

An embodiment of a switching element unit and a switching element module will be described with reference to the drawings. It should be noted that, in the following description, the dimensions, the arrangement directions, the arrangement positions, and so on of members include differences caused by errors (allowable level of errors in manufacturing). Further, as used in this disclosure, the term "rotary electric machine" refers to any of a motor (electric motor), a generator (electric generator), and a motor generator that serve as both a motor and a generator as necessary.

The switching element unit 10 is used in an inverter circuit 100 (see FIG. 7) that performs power conversion between DC power and AC power. AS illustrated in FIG. 7, the inverter circuit 100 is disposed between a DC power supply 6 (DC voltage supply source) and a rotary electric machine MG. The DC power supply 6 may include, for example, a battery or a capacitor. A capacitor 7 (smoothing capacitor) is disposed between the DC power supply 6 and the inverter circuit 100. The capacitor 7 smoothens the voltage on the DC side of the inverter circuit 100. The rotary electric machine MG is an AC rotary electric machine driven with AC power. The rotary electric machine MG is driven when AC power is supplied from the inverter circuit 100 to the rotary electric machine MG. The rotary electric machine MG is a rotary electric machine used in a vehicle such as an electric vehicle and a hybrid vehicle to serve as a driving force source of the vehicle (wheels). As will be described below in detail, the switching element unit 10 may be used alone (see FIG. 5), or may be used with one or more switching element units 10 connected in parallel (electrically connected in parallel) thereto (see FIG. 6). FIG. 7 illustrates an example in which two switching element units 10, each forming one inverter circuit 100, are connected in parallel. Thus, two inverter circuits 100 are electrically connected in parallel to the DC power supply 6. In the present embodiment, the rotary electric machine MG corresponds to an "AC device".

As illustrated in FIG. 7, the inverter circuit 100 includes a bridge circuit. In the present embodiment, the bridge circuit includes arms equal in number to the number of phases. The arms are electrically connected in parallel. In the present embodiment, the rotary electric machine MG is an AC rotary electric machine driven with three-phase (an example of multi-phase) AC power, and the bridge circuit includes three arms electrically connected in parallel. Each arm includes a series circuit including an upper-stage switching element 30U of an upper-stage arm, and a lower-stage switching element 30L of a lower-stage arm. A positive-side end of the series circuit is connected to a positive bus bar 70P connected to a positive electrode 6P of the DC power supply 6, and a negative-side end of the series circuit is connected to a negative bus bar 70N connected to a negative electrode 6N of the DC power supply 6. Then, a midpoint (a connection point of the upper-stage switching element 30U and the lower-stage switching element 30L) of each of the plurality of arms is electrically connected to a coil (a stator coil in this example) of the corresponding phase of the rotary electric machine MG. It should be noted that a rectifying diode element 33 (freewheeling diode) is connected in parallel to each of the switching elements (30U, 30L).

A control terminal (a gate terminal in this example) of each of the switching elements (30U, 30L) is connected to a control device 4 via a drive circuit 5. Then, the switching of each of the switching elements (30U, 30L) is controlled according to a switching control signal generated by the control device 4, so that AC power is supplied from the inverter circuit 100 to the rotary electric machine MG. Unlike the example illustrated in FIG. 7, the voltage between the positive electrode and the negative electrode of the DC power supply 6 may be increased or reduced and applied between the positive bus bar 70P and the negative bus bar 70N. In this case, the positive bus bar 70P is connected to the positive electrode 6P of the DC power supply 6 via a step-up circuit or a step-down circuit.

Figure 5:
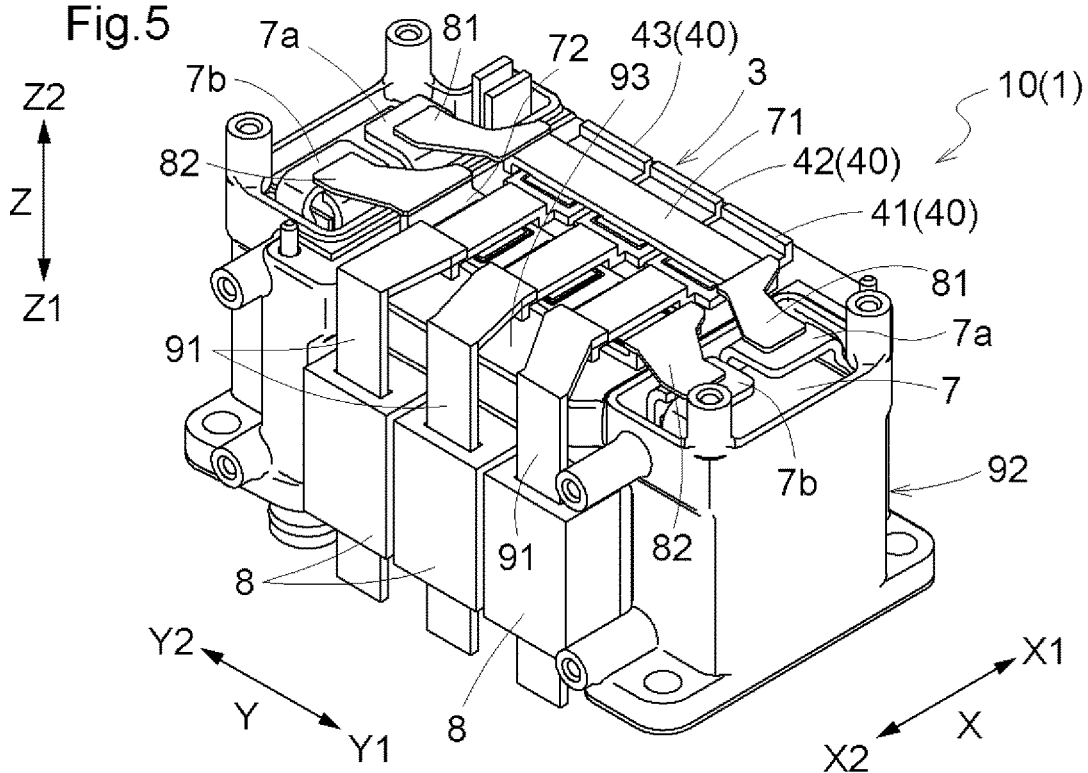
FIG. 5 is a perspective view illustrating a switching element unit according to the embodiment.

As illustrated in FIGS. 1 to 4, the switching element unit 10 includes a switching element set 20, a first bus bar 71, a second bus bar 72, an output bus bar 40, and a molded portion 2. As illustrated in FIG. 5, in the present embodiment, the switching element unit 10 is a unit that is integrated with the capacitor 7 and a case 92 accommodating the capacitor 7. However, FIGS. 1 and 4 illustrate only a part thereof (mainly only a molded unit 3). The molded unit 3 is a unit integrated by the molded portion 2. Specifically, the molded unit 3 includes the switching element set 20, the first bus bar 71, the second bus bar 72, and the output bus bar 40 that are integrated by the molded portion 2. The molded portion 2 is formed of a molding material (for example, resin), and is provided to hold the switching element set 20, the first bus bar 71, the second bus bar 72, and the output bus bar 40.

The switching element set 20 is a set of switching elements that form the inverter circuit 100 (see FIG. 7). As illustrated in FIG. 4, the switching element set 20 includes a first switching element 31 connected to the first bus bar 71 and the output bus bar 40, and a second switching element 32 connected to the second bus bar 72 and the output bus bar 40. In the present embodiment, the switching element set 20 includes one first switching element 31 and one second switching element 32. As illustrated in FIGS. 1 and 4, the first switching element 31 and the second switching element 32 are disposed to be embedded in the molded portion 2. The output bus bar 40 is connected to both the first switching element 31 and the second switching element 32. That is, the output bus bar 40 is disposed to electrically connect the first switching element 31 and the second switching element 32, and the potential of the output bus bar 40 corresponds to the potential of the midpoint of the arm of the inverter circuit 100.

Each of the first switching element 31 and the second switching element 32 may be, for example, a power semiconductor element such as an IGBT (Insulated Gate Bipolar Transistor) and a MOSFET (Metal Oxide Semiconductor Field Effect Transistor). In the present embodiment, each of the first switching element 31 and the second switching element 32 is a chip-type element having a diode element 33 therein (see FIG. 7). The chip-type element has a flat-plate-shaped outer contour, and is disposed such that the direction orthogonal to the plate surface is aligned with a below-described third direction Z.

The first bus bar 71 is connected to one of the positive electrode 6P and the negative electrode 6N of the DC power supply 6, and the second bus bar 72 is connected to the other one of the positive electrode 6P and the negative electrode 6N of the DC power supply 6. In the present embodiment, the switching element unit 10 includes one first bus bar 71 and one second bus bar 72. As described above, the first switching element 31 is connected to the first bus bar 71 and the output bus bar 40, and the second switching element 32 is connected to the second bus bar 72 and the output bus bar 40. Accordingly, in the case where the first bus bar 71 is connected to the positive electrode 6P of the DC power supply 6, and the second bus bar 72 is connected to the negative electrode 6N of the DC power supply 6, that is, in the case where the first bus bar 71 serves as the positive bus bar 70P, and the second bus bar 72 serves as the negative bus bar 70N, the first switching element 31 serves as the upper-stage switching element 30U, and the second switching element 32 serves as the lower-stage switching element 30L. Further, in the case where the first bus bar 71 is connected to the negative electrode 6N of the DC power supply 6, and the second bus bar 72 is connected to the positive electrode 6P of the DC power supply 6, that is, in the case where the first bus bar 71 serves as the negative bus bar 70N, and the second bus bar 72 serves as the positive bus bar 70P, the first switching element 31 serves as the lower-stage switching element 30L, and the second switching element 32 serves as the upper-stage switching element 30U. In the present embodiment, the first bus bar 71 serves as the negative bus bar 70N, and the second bus bar 72 serves as the positive bus bar 70P. However, the first bus bar 71 may serve as the positive bus bar 70P, and the second bus bar 72 may serve as the negative bus bar 70N.

The output bus bar 40 is connected to an AC device (the rotary electric machine MG in the present embodiment). In the present embodiment, the output bus bar 40 is electrically connected to the rotary electric machine MG via a device connection bus bar 91 (see FIGS. 5 to 7). In the present embodiment, the switching element unit 10 includes a plurality of switching element sets 20, and a plurality of output bus bars 40 corresponding to the plurality of switching element sets 20. In this example, the switching element unit 10 includes the switching element sets 20 equal in number to the number of phases, and the output bus bars 40 equal in number to the number of phases. Specifically, as illustrated in FIG. 3, the switching element unit 10 includes three switching element sets 20, namely, a first switching element set 21, a second switching element set 22, and a third switching element set 23, and includes three output bus bars 40, namely, a first output bus bar 41, a second output bus bar 42, and a third output bus bar 43. Accordingly, in the present embodiment, as illustrated in FIG. 7, one switching element unit 10 forms one inverter circuit 100.

As illustrated in FIGS. 3 and 4 (see also FIG. 2), the first switching element 31 and the second switching element 32 included in each switching element set 20 are arranged side by side in a first direction X. Further, the output bus bar 40 is disposed to be in contact with the first switching element 31 and the second switching element 32 included in the corresponding switching element set 20. Specifically, the output bus bar 40 is disposed to extend in the first direction X while being in contact with the surface of the first switching element 31 opposite to the surface in contact with the first bus bar 71, and being in contact with the surface of the second switching element 32 opposite to the surface in contact with the second bus bar 72. The term "be in contact" as used herein means a state in which objects are in direct contact with each other or a state in which objects are in contact with each other with a bonding layer interposed therebetween. In the following description, one side in the first direction X (specifically, the side of the switching element set 20 on which a below-described first exposed portion 40a is disposed) is defined as a third side X1, and the side opposite to the third side X1 in the first direction X is defined as a fourth side X2.

Although not illustrated, each of the first switching element 31 and the second switching element 32 includes a pair of main terminals (an emitter terminal and a collector terminal in the case where an IGBT is used as a switching element). The surface of the first switching element 31 in contact with the first bus bar 71 is formed such that one of the two main terminals is electrically connected to the first bus bar 71, and the surface of the first switching element 31 in contact with the output bus bar 40 is formed such that the other one of the two main terminals is electrically connected to the output bus bar 40. Further, the surface of the second switching element 32 in contact with the second bus bar 72 is formed such that one of the two main terminals is electrically connected to the second bus bar 72, and the surface of the second switching element 32 in contact with the output bus bar 40 is formed such that the other one of the two main terminals is electrically connected to the output bus bar 40.

As described above, in the present embodiment, the switching element unit 10 includes the plurality of switching element sets 20. Accordingly, the switching element unit 10 includes the plurality of first switching elements 31 and the plurality of second switching elements 32. In the present embodiment, the switching element unit 10 includes the first switching elements 31 equal in number to the number of switching element sets 20, and the second switching elements 32 equal in number to the number of switching element sets 20. As illustrated in FIG. 3, the plurality of first switching elements 31 are arranged side by side in a second direction Y, and the plurality of second switching elements 32 are arranged side by side in the second direction Y. Further, the plurality of output bus bars 40 are arranged side by side in the second direction Y in accordance with the arrangement of the plurality of switching element sets 20. Here, the second direction Y is the direction crossing the first direction X. In the present embodiment, the second direction Y is the direction orthogonal to the first direction X. In the following description, one side in the second direction Y is defined as a fifth side Y1, and the side opposite to the fifth side Y1 in the second direction Y is defined as a sixth side Y2.

As illustrated in FIG. 4, in the present embodiment, the first switching element 31 and the second switching element 32 included in each switching element set 20 are located in a common reference plane, namely, a first reference plane S1. In this example, all the first switching elements 31 and the second switching elements 32 included in the switching element unit 10 are located in the first reference plane S1. Here, the orthogonal direction that is orthogonal to the first reference plane S1 is defined as a third direction Z. Further, one side in the third direction Z is defined as a first side Z1, and the side opposite to the first side Z1 in the third direction Z is defined as a second side Z2. The third direction Z coincides with the direction orthogonal to both the first direction X and the second direction Y.

As illustrated in FIG. 4, the output bus bar 40 includes a first joining portion 51b in contact with the first switching element 31, and a second joining portion 52b in contact with the second switching element 32. Further, in the present embodiment, the first joining portion 51b is disposed to be in contact with a surface on the first side Z1 of the first switching element 31, and the second joining portion 52b is disposed to be in contact with a surface on the second side Z2 of the second switching element 32. Therefore, in the present embodiment, the output bus bar 40 includes a bent portion 53 for locating the first joining portion 51b on the first side Z1 with respect to the second joining portion 52b, between the first joining portion 51b and the second joining portion 52b in the extending direction of the output bus bar 40. As illustrated in FIG. 4, in the present embodiment, the bent portion 53 is formed such that a surface on the first side Z1 of the first joining portion 51b and a surface on the first side Z1 of the second bus bar 72 are located in the same plane (in a below-described third reference plane S3) parallel to the first reference plane S1, and such that a surface on the second side Z2 of the second joining portion 52b and a surface on the second side Z2 of the first bus bar 71 are located in the same plane (in a below-described second reference plane S2) parallel to the first reference plane S1.

Figure 2:
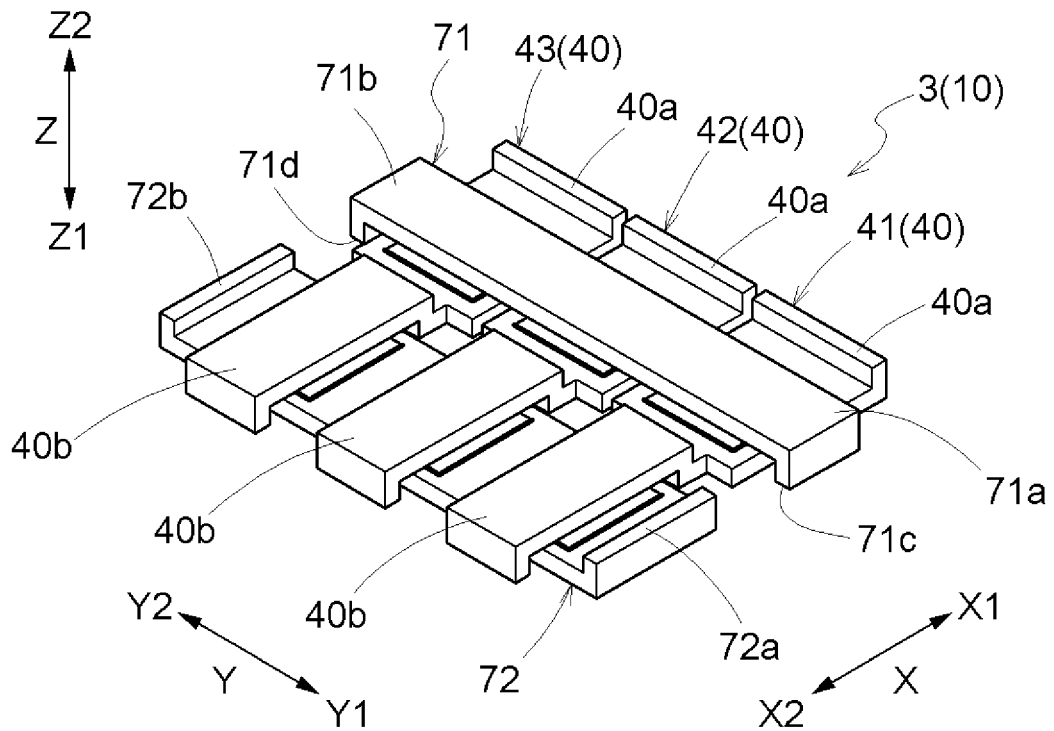
FIG. 2 is a perspective view illustrating a part of the molded unit according to the embodiment.

As illustrated in FIGS. 1 to 3, each of the first bus bar 71 and the second bus bar 72 is disposed to extend in the second direction Y. Specifically the first bus bar 71 is disposed to extend in the second direction Y while being in contact with all the first switching elements 31 (three first switching elements 31 in this example). In the present embodiment, since the first joining portion 51b of the output bus bar 40 is in contact with the surface on the first side Z1 of the first switching element 31, the first bus bar 71 is disposed to be in contact with a surface on the second side Z2 of the first switching element 31. Further, the second bus bar 72 is disposed to extend in the second direction Y while being in contact with all the second switching elements 32 (three second switching elements 32 in this example). In the present embodiment, since the second joining portion 52b of the output bus bar 40 is in contact with the surface on the second Z2 side of the second switching element 32, the second bus bar 72 is disposed to be in contact with a surface on the first side Z1 of the second switching element 32.

The switching element unit 10 is designed not only to be used alone, but also to be used with one or more switching element units 10 connected in parallel (electrically connected in parallel) thereto. The number and combination of switching element units 10 to be connected in parallel may be changed so as to adjust the current capacity as a whole. For example, assume that a switching element unit 10 with a current capacity of C1 [A] (hereinafter referred to as a "first-type unit") and a switching element unit 10 with a current capacity of C2 [A] (hereinafter referred to as a "second-type unit") are manufactured, and a single unit is used, or two units are connected in parallel and used. Then, the current capacity is adjustable to any of the following five: C1 [A] in the case where a single first-type unit is used; C2 [A] in the case where a single second-type unit is used; (2×C1) [A] in the case two first-type units connected in parallel are used; (C1+C2) [A] in the case where a single first-type unit and a single second-type unit connected in parallel are used; and (2×C2) [A] in the case where two second-type units connected in parallel are used.

In the case where the switching element unit 10 is not only used alone, but also used with one or more switching element units 10 connected in parallel thereto, it is preferable that the electrical connection structure for electrically connecting the plurality of switching element units 10 in parallel is simple. In the following, a description will be given of the configuration that simplifies the electrical connection structure for connecting the plurality of switching element units 10 in parallel, in the switching element unit 10 according to the present embodiment.

As illustrated in FIGS. 1 and 4, the output bus bar 40 includes an embedded portion 40c embedded in the molded portion 2, a first exposed portion 40a exposed from the molded portion 2 on one side (the third side X1) of the corresponding switching element set 20 in the first direction X, and a second exposed portion 40b exposed from the molded portion 2 on the other side (the fourth side X2) of the corresponding switching element set 20 in the first direction X. In the present embodiment, both the first exposed portion 40a and the second exposed portion 40b are defined by regions of the output bus bar 40 exposed from the molded portion 2 to the second side Z2.

Specifically, as illustrated in FIG. 4, the output bus bar 40 includes, sequentially from one side in the extending direction of the output bus bar 40, a first extending portion 51a, the above-described first joining portion 51b, the above-described second joining portion 52b, and a second extending portion 52a. Then, the first extending portion 51a includes a first part 61 extending in the first direction X from the first joining portion 51b to the third side X1, and a second part 62 extending from an end of the first part 61 on the side opposite to the first joining portion 51b (that is, an end on the third side X1) to the second side Z2. It should be noted that the second part 62 extends to the second side Z2 so as to be exposed from the molded portion 2 to the second side Z2. The second extending portion 52a includes a third part 63 extending in the first direction X from the second joining portion 52b to the fourth side X2. A surface on the second side Z2 of the second joining portion 52b is exposed from the molded portion 2 to the second side Z2, and the third part 63 extends in the first direction X from the second joining portion 52b while being exposed from the molded portion 2 to the second side Z2. The region of the second part 62 exposed from the molded portion 2 to the second side Z2 defines the first exposed portion 40a, and the region of the third part 63 exposed from the molded portion 2 to the second side Z2 defines the second exposed portion 40b.

As illustrated in FIG. 1, in the present embodiment, the first bus bar 71 is disposed to be exposed from the molded portion 2, on both sides of the plurality of first switching elements 31 (three first switching elements in this example; the same applies to the following description) in the second direction Y. Specifically, the first bus bar 71 includes a third exposed portion 71a exposed from the molded portion 2 on the fifth side Y1 of the plurality of first switching elements 31, and a fourth exposed portion 71b exposed from the molded portion 2 on the sixth side Y2 of the plurality of first switching elements 31. In the present embodiment, as illustrated in FIG. 1, the first bus bar 71 is disposed to be exposed from the molded portion 2 to the second side Z2, throughout the region in the second direction Y where the plurality of first switching elements 31 are disposed. The region of the first bus bar 71 exposed from the molded portion 2 to the second side Z2 on the fifth side Y1 of the plurality of first switching elements 31 defines the third exposed portion 71a, and the region of the first bus bar 71 exposed from the molded portion 2 to the second side Z2 on the sixth side Y2 of the plurality of first switching elements 31 defines the fourth exposed portion 71b.

Further, as illustrated in FIG. 1, in the present embodiment, the second bus bar 72 is disposed to be exposed from the molded portion 2, on both sides of the plurality of second switching elements 32 (three second switching elements 32 in this example; the same applies to the following description) in the second direction Y. Specifically, the second bus bar 72 includes a fifth exposed portion 72a exposed from the molded portion 2 on the fifth side Y1 of the plurality of second switching elements 32, and a sixth exposed portion 72b exposed from the molded portion 2 on the sixth side Y2 of the plurality of second switching elements 32. In the present embodiment, as illustrated in FIG. 2, the second bus bar 72 is formed such that an end thereof on the fifth side Y1 extends to the second side Z2 so as to be exposed from the molded portion 2 to the second side Z2, on the fifth side Y1 of the plurality of second switching elements 32, and the region exposed from the molded portion 2 to the second side Z2 at the end of the second bus bar 72 on the fifth side Y1 defines the fifth exposed portion 72a. Further, the second bus bar 72 is formed such that an end thereof on the sixth side Y2 extends to the second side Z2 so as to be exposed from the molded portion 2 to the second side Z2, on the sixth side Y2 of the plurality of second switching elements 32, and the region exposed from the molded portion 2 to the second side Z2 at the end of the second bus bar 72 on the sixth side Y2 defines the sixth exposed portion 72b.

As described above, the output bus bar 40 includes the exposed portions (40a, 40b) exposed from the molded portion 2, on both sides of the switching element set 20 in the first direction X. Further, in the present embodiment, the first bus bar 71 includes the exposed portions (71a, 71b) exposed from the molded portion 2, on both sides of the plurality of first switching elements 31 in the second direction Y, and the second bus bar 72 includes the exposed portions (72a, 72b) exposed from the molded portion 2, on both sides of the plurality of second switching elements 32 in the second direction Y. Since the switching element unit 10 is configured as described above, it is possible to simplify the electrical connection structure for connecting the plurality of switching element units 10 in parallel as will be descried below.

Figure 6:
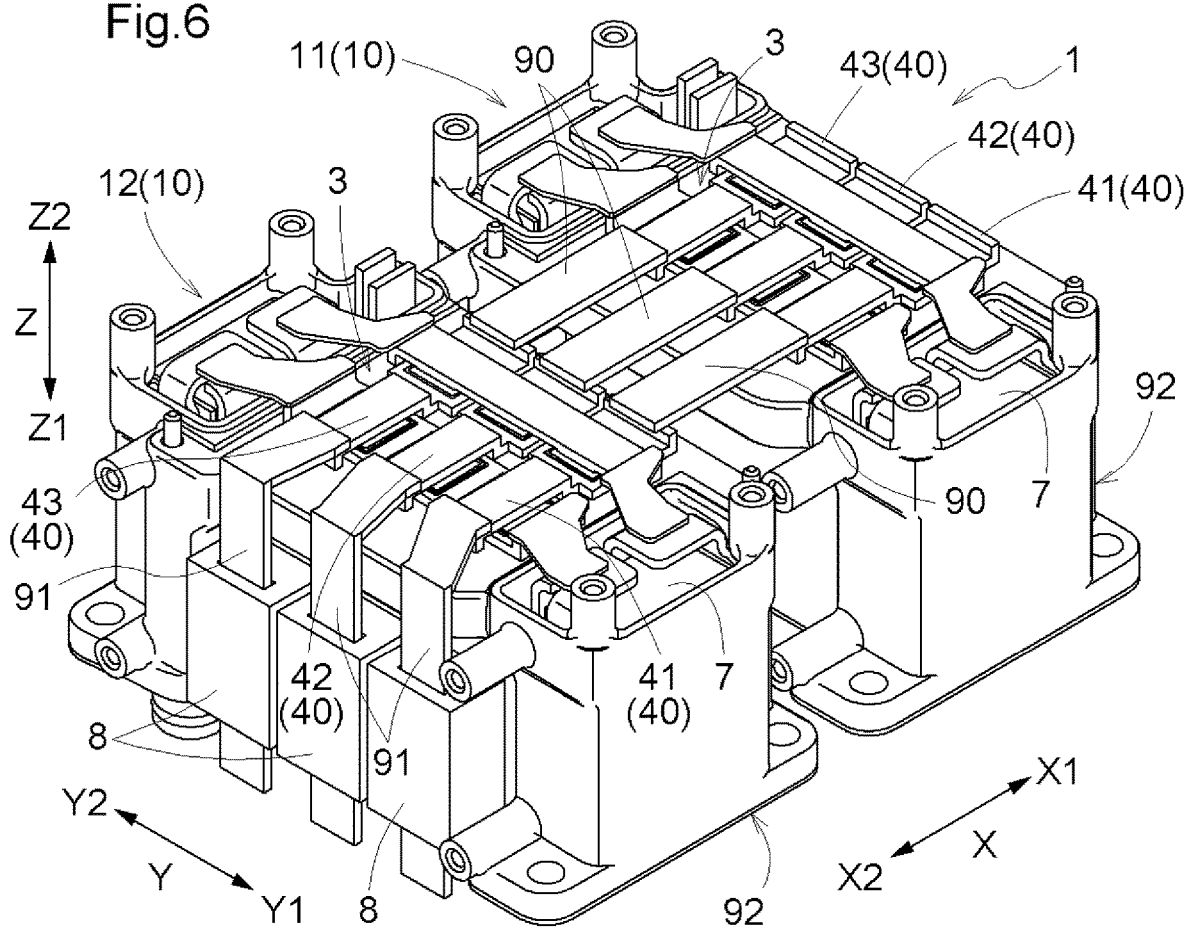
FIG. 6 is a perspective view illustrating a switching element module according to the embodiment.
Figure 7:
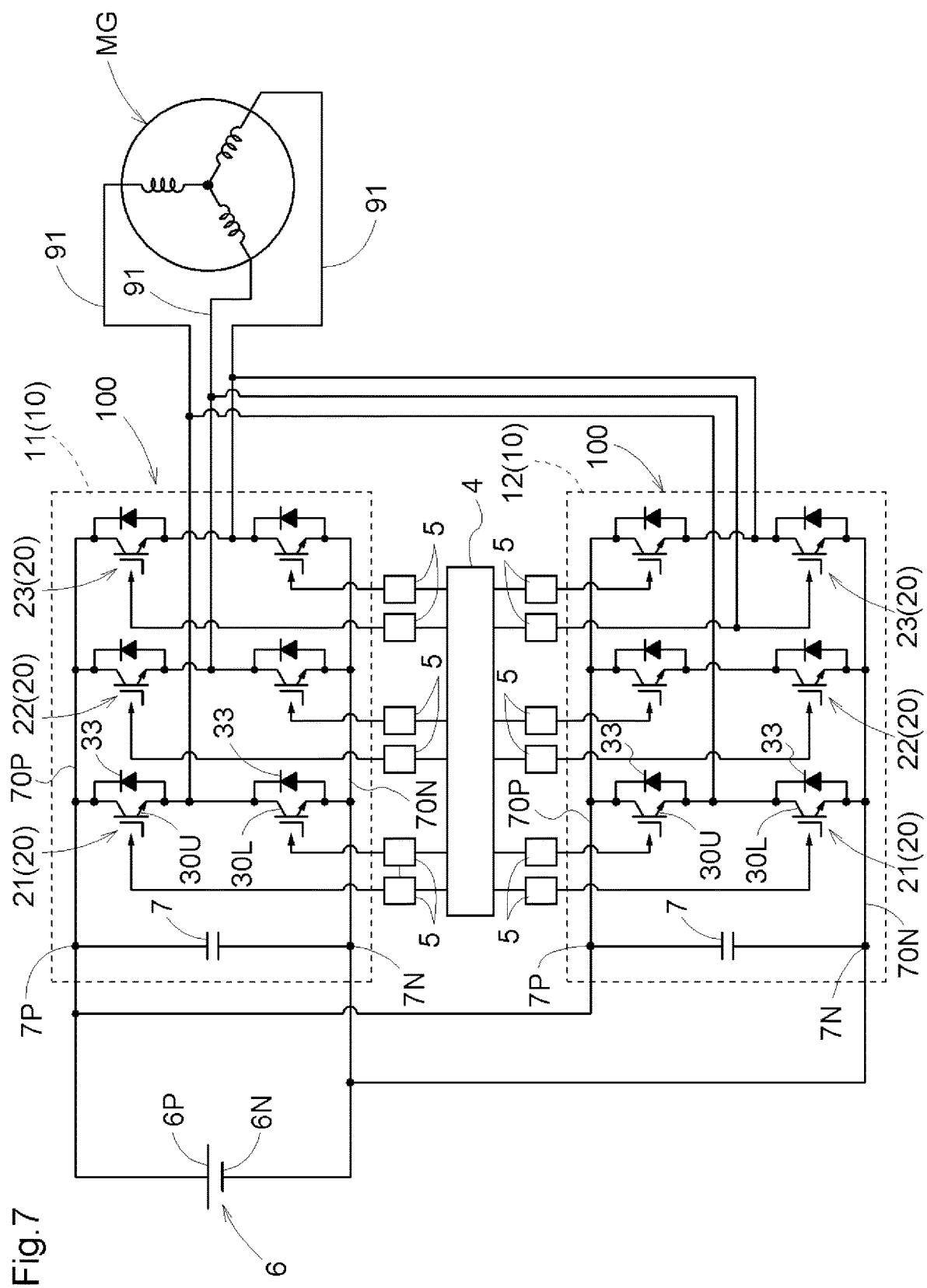
FIG. 7 is a configuration diagram illustrating an inverter circuit according to the embodiment.
Figure 8:
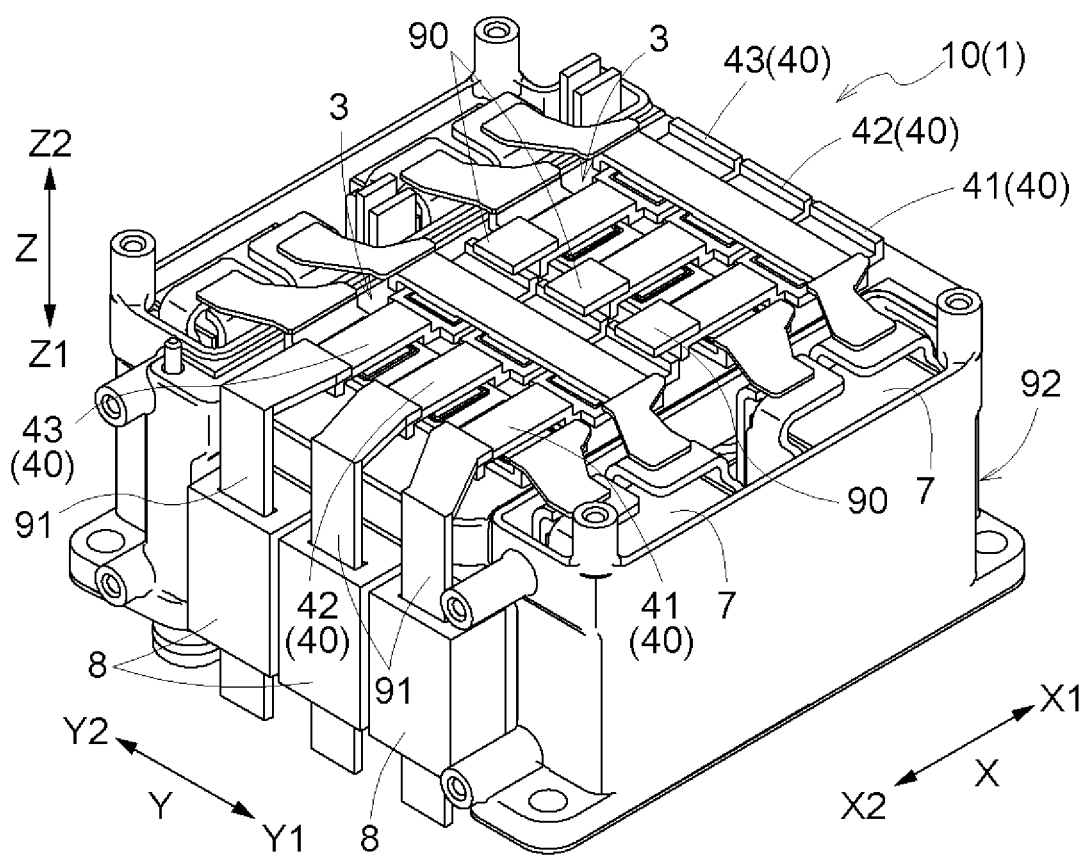
FIG. 8 is a perspective view illustrating a switching element module according to another embodiment.

As illustrated in FIG. 6, a switching element module 1 is a module including a plurality of switching element units 10. In FIGS. 5 and 6 and FIG. 8 to be referred to later, the molded portion 2 is not illustrated for easy understanding of the arrangement configuration of the output bus bar 40 and other elements. The plurality of switching element units 10 of the switching element module 1 include a first switching element unit 11 and a second switching element unit 12 arranged side by side in the first direction X. The first switching element unit 11 is disposed on the third side X1 of the second switching element unit 12 in the first direction X. As illustrated in FIG. 6, the first switching element unit 11 and the second switching element unit 12 basically have the same configuration except that only the second switching element unit 12 is provided with a current sensor 8 that detects current flowing through the device connection bus bar 91. The first switching element unit 11 and the second switching element unit 12 are arranged side by side in the first direction X, in the same position in the second direction Y. Accordingly, a first output bus bar 41 of the first switching element unit 11 and a first output bus bar 41 of the second switching element unit 12 are arranged side by side in the first direction X; a second output bus bar 42 of the first switching element unit 11 and a second output bus bar 42 of the second switching element unit 12 are arranged side by side in the first direction X; and a third output bus bar 43 of the first switching element unit 11 and a third output bus bar 43 of the second switching element unit 12 are arranged side by side in the first direction X.

Further, as illustrated in FIG. 6 (see also FIG. 2), a second exposed portion 40b of the first switching element unit 11 (a second exposed portion 40b of the output bus bar 40 of the first switching element unit 11) and a first exposed portion 40a of the second switching element unit 12 (a first exposed portion 40a of the output bus bar 40 of the second switching element unit 12) are connected to each other with a connection bus bar 90 disposed to extend in the first direction X. Specifically, a second exposed portion 40b of the first output bus bar 41 of the first switching element unit 11 and a first exposed portion 40a of the first output bus bar 41 of the second switching element unit 12 are connected to each other with a connection bus bar 90 (first connection bus bar). Also, a second exposed portion 40b of the second output bus bar 42 of the first switching element unit 11 and a first exposed portion 40a of the second output bus bar 42 of the second switching element unit 12 are connected to each other with a connection bus bar 90 (second connection bus bar). Further, a second exposed portion 40b of the third output bus bar 43 of the first switching element unit 11 and a first exposed portion 40a of the third output bus bar 43 of the second switching element unit 12 are connected to each other with a connection bus bar 90 (third connection bus bar).

In this manner, the plurality of switching element units 10 are arranged in the first direction X, and the second exposed portion 40b of the switching element unit 10 of the two adjacent switching element units 10 that is disposed on the third side X1 (the first switching element unit 11 in the example of FIG. 6) and the first exposed portion 40a of the switching element unit 10 that is disposed on the fourth side X2 (the second switching element unit 12 in the example of FIG. 6) are connected to each other. Thus, the output bus bars 40 can be connected to each other without interposing any of the switching element sets 20 of these two switching element units 10. Moreover, since two output bus bars 40 to be connected are arranged side by side in the first direction X, the output bus bars 40 can be connected to each other without interposing an electrical connection structure for connecting other output bus bars 40 to each other. This makes it possible to simplify the electrical connection structure for connecting the output bus bars 40 to each other.

In the example illustrated in FIG. 6, the device connection bus bar 91 is connected to a second exposed portion 40b of the output bus bar 40 of the second switching element unit 12. Specifically, device connection bus bars 91 are connected to the respective second exposed portions 40b of the plurality of output bus bars 40 (three output bus bars 40 in this example) of the second switching element unit 12. As described above, since two switching element units 10 (the first switching element unit 11 and the second switching element unit 12) are connected in parallel, a circuit having two inverter circuits 100 electrically connected in parallel is formed as illustrated in FIG. 7.

As illustrated in FIG. 6, in the present embodiment, each of the first switching element unit 11 and the second switching element unit 12 is a unit that is integrated with the capacitor 7 electrically connected in parallel to the series circuit of the first switching element 31 and the second switching element 32 included in the switching element set 20. That is, in the present embodiment, the switching element unit 10 is a unit integrated with the capacitor 7.

Specifically, as illustrated in FIG. 5, the switching element unit 10 includes the capacitor 7, and the case 92 accommodating the capacitor 7, in addition to the molded unit 3. Although not described in detail, in the present embodiment, the case 92 accommodates a plurality of capacitor elements included in the capacitor 7. The molded unit 3 is fixed to a fixing portion 93 formed on the case 92. As illustrated in FIG. 4, the upper surface of the fixing portion 93 is a flat surface, and the molded unit 3 is fixed to the fixing portion 93 from the second side Z2. Although not illustrated, in the present embodiment, an insulating resin sheet (adhesive sheet) is interposed between the molded unit 3 and the fixing portion 93. Further, in the present embodiment, the fixing portion 93 is cooled by a cooling device provided in the case 92. That is, the fixing portion 93 is configured to serve as a heatsink, and is capable of cooling the members included in the molded unit 3 fixed to the fixing portion 93, by using the cooling device. That is, a surface on the first side of the molded unit 3 Z1 is a cooled surface 3*a* that is cooled by the cooling device.

As illustrated in FIG. 5, the capacitor 7 includes a first terminal 7*a* connected to the first bus bar 71, and a second terminal 7*b* connected to the second bus bar 72. In the case where the first bus bar 71 serves as the positive bus bar 70P, and the second bus bar 72 serves as the negative bus bar 70N, the first terminal 7*a* serves as a positive terminal 7P of the capacitor 7, and the second terminal 7*b* serves as a negative terminal 7N of the capacitor 7. Whereas, in the case where the first bus bar 71 serves as the negative bus bar 70N, and the second bus bar 72 serves as the positive bus bar 70P, the first terminal 7*a* serves as the negative terminal 7N of the capacitor 7, and the second terminal 7*b* serves as the positive terminal 7P of the capacitor 7. In the present embodiment, the capacitor 7 includes a set of the first terminal 7*a* and the second terminal 7*b*, on each side of the molded unit 3 in the second direction Y. Then, as illustrated in FIG. 5 (see also FIG. 2), the third exposed portion 71*a* of the first bus bar 71 and the first terminal 7*a* on the fifth side Y1 are connected (with a first electrode bus bar 81 in this example), and the fourth exposed portion 71*b* of the first bus bar 71 and the first terminal 7*a* on the sixth side Y2 are connected (with another first electrode bus bar 81 in this example). Also, the fifth exposed portion 72*a* of the second bus bar 72 and the second terminal 7*b* on the fifth side Y1 are connected (with a second electrode bus bar 82 in this example), and the sixth exposed portion 72*b* of the second bus bar 72 and the second terminal 7*b* on the sixth side Y2 are connected (with another second electrode bus bar 82 in this example). In this manner, in the present embodiment, the first bus bar 71 and the second bus bar 72 are connected to the capacitor 7 on both sides of the switching element set 20 in the second direction Y. Therefore, the effective wiring length between the switching element set 20 and the capacitor 7 is reduced, thereby reducing the inductance.

Although not illustrated, the plurality of switching element units 10 of the switching element module 1 may include two switching element units 10 arranged side by side in the second direction Y. In this case, a fourth exposed portion 71*b* of a first bus bar 71 of the switching element unit 10 disposed on the fifth side Y1 among the two switching element units 10 adjacent in the second direction Y and a third exposed portion 71*a* of a first bus bar 71 of the switching element unit 10 disposed on the sixth side Y2 are connected to each other. This makes it possible to simplify the electrical connection structure for connecting the first bus bars 71. Similarly, a sixth exposed portion 72*b* of a second bus bar 72 of the switching element unit 10 disposed on the fifth side Y1 among the two switching element units 10 adjacent in the second direction Y and a fifth exposed portion 72*a* of a second bus bar 72 of the switching element unit 10 disposed on the sixth side Y2 are connected to each other. This makes it possible to simplify the electrical connection structure for connecting the second bus bars 72.

As illustrated in FIG. 4, in the present embodiment, a first distal end 62*a* defining a distal end (an end face on the second side Z2) of the second part 62, a surface on the second side Z2 of the second joining portion 52*b*, and a surface on the second side Z2 of the third part 63 are located in the same plane (in the second reference plane S2 in this example) parallel to the first reference plane S1. The second reference plane S2 is located on the second side Z2 with respect to an end face on the second side Z2 of the molded portion 2. In the present embodiment, the surface on the second side Z2 of the first bus bar 71 and surfaces on the second side Z2 at both ends of the second bus bar 72 in the second direction Y (distal ends (end faces on the second side Z2) of the portions defining the exposed portions (72*a*, 72*b*)) are also located in the second reference plane S2. Accordingly, when the molded unit 3 is press-fitted and fixed to the fixing portion 93 from the second side Z2 during manufacture of the switching element unit 10, the plurality of portions located in the second reference plane S2 serve as pressed portions that are pressed to the first side Z1 by a jig or the like. Since the plurality of pressed portions are located in the same plane, it is easy to apply a load uniformly to the plurality of pressed portions and appropriately press-fit the molded unit 3 to the fixing portion 93.

Also, as illustrated in FIG. 4, in the present embodiment, the second extending portion 52*a* of the output bus bar 40 includes a fourth part 64 extending from an end of the third part 63 on the side opposite to the second joining portion 52*b* (that is, an end on the fourth side X2) to the first side Z1. Further, a second distal end 64*a* defining a distal end (an end face on the first side Z1) of the fourth part 64, the surface on the first side Z1 of the first joining portion 51*b*, and a surface on the first side Z1 of the first part 61 are located in the same plane (in the third reference plane S3 in this example) parallel to the first reference plane S1. In FIG. 4, the third reference plane S3 is located in the same position as an end face on the first side Z1 of the molded portion 2. However, the third reference plane S3 may be a plane displaced from the end face on the first side Z1 of the molded portion 2 to the first side Z1 or to the second side Z2. In the present embodiment, the surface on the first side Z1 of the second bus bar 72, a third distal end 71*c* of the first bus bar 71, and a fourth distal end 71*d* of the first bus bar 71 are also located in the third reference plane S3. As illustrated in FIG. 2, in the present embodiment, the first bus bar 71 is formed such that an end thereof on the fifth side Y1 extends to the first side Z1, on the fifth side Y1 of the plurality of first switching elements 31, and an end face on the first side Z1 at the end of the first bus bar 71 on the fifth side Y1 defines the third distal end 71*c*. Also, the first bus bar 71 is formed such that an end thereof on the sixth side Y2 extends to the first side Z1, on the sixth side Y2 of the plurality of first switching elements 31, and an end face on the first side Z1 at the end on the sixth side Y2 of the first bus bar 71 defines the fourth distal end 71*d*.

As described above, in the present embodiment, since the second distal end 64*a*, the surface on the first side Z1 of the first joining portion 51*b*, and the surface on the first side Z1 of the first part 61 are disposed in the third reference plane S3, these elements are disposed close to the cooling device (fixing portion 93) (for example, disposed to face the fixing portion 93) that cools the cooled surface 3*a*. This makes it possible to efficiently cool the output bus bar 40. Further, in the present embodiment, since the surface on the first side Z1 of the second bus bar 72, the third distal end 71c of the first bus bar 71, and the fourth distal end 71d of the first bus bar 71 are also located in the third reference plane S3, these elements are disposed close to the cooling device (fixing portion 93) (for example, disposed to face the fixing portion 93) that cools the cooled surface 3a. This makes it possible to efficiently cool the first bus bar 71 and the second bus bar 72.

Moreover, when the molded unit 3 is press-fitted and fixed to the fixing portion 93 from the second side Z2 during manufacture of the switching element unit 10, a plurality of portions located in the third reference plane S3 serve as support portions that receive a pressing load applied to the molded unit 3. That is, the output bus bar 40, the first bus bar 71, and the second bus bar 72 are configured such that their end faces on the second side Z2 serve as the pressed portions described above, and their end faces on the first side Z1 serve as the support portions described herein. This makes it possible to appropriately protect the switching element set 20 while reducing the pressing load applied to the switching element set 20 in the press-fitting and fixing step.

OTHER EMBODIMENTS

The following describes other embodiments of a switching element unit and a switching element module.

(1) In the above embodiment, each switching element unit 10 includes first switching elements 31 equal in number to the number of phases, and second switching elements 32 equal in number to the number of phases. However, the present disclosure is not limited to this configuration. Each switching element unit 10 may include first switching elements 31 different in number from the number of phases, and second switching elements 32 different in number from the number of phases. FIG. 8 illustrates an example of this configuration.

In the example illustrated in FIG. 8, a switching element unit 10 corresponds to two switching element units 10 of FIG. 6 integrated by combining the cases 92 of the two switching element units 10 into a single case 92. Therefore, the switching element unit 10 of FIG. 8 includes two molded units 3 of FIG. 1, and includes twice the number of first switching elements 31 as the number of phases, and twice the number of second switching elements 32 as the number of phases. In this case, a single switching element unit 10 forms two inverter circuits 100 (see FIG. 7) that are electrically connected in parallel to each other. Further, in this case, unlike the above embodiment, the single switching element unit 10 includes twice the number of switching element sets 20 as the number of phases, and twice the number of output bus bars 40 as the number of phases.

In the configuration illustrated in FIG. 8, two output bus bars 40 arranged side by side in the first direction X may be formed integrally, and the connection bus bar 90 may not be provided. In this case, unlike the above embodiment, a first exposed portion 40a of each output bus bar 40 is formed to be exposed from the molded portion 2, on the third side X1 of the switching element set 20 including two first switching elements 31 and two second switching elements 32. Further, a second exposed portion 40b of each output bus bar 40 is formed to be exposed from the molded portion 2, on the fourth side X2 of the switching element set 20 including two first switching elements 31 and two second switching elements 32. In this manner, a single switching element set 20 may include a plurality of first switching elements 31 and a plurality of second switching elements 32.

(2) In the above embodiment, the rotary electric machine MG is an AC rotary electric machine driven with multiphase AC power. However, the rotary electric machine MG may be an AC rotary electric machine driven with single-phase AC power. In this case, the switching element unit 10 may include two switching element sets 20, instead of including switching element sets 20 equal in number to the number of phases (specifically, three switching element sets 20) as in the above embodiments.

(3) In the above embodiment, each switching element unit 10 includes the required number of (three in the above embodiment) switching element sets 20 to form a single inverter circuit 100. However, the present disclosure is not limited to this configuration. Each switching element unit 10 may include less than the required number of switching element sets 20 (for example, one switching element set 20) to form a single inverter circuit 100, and a plurality of switching element units 10 (for example, a plurality of switching element units 10 arranged side by side in the second direction Y) may form a single inverter circuit 100.

(4) In the above embodiment, the second exposed portion 40b of the first switching element unit 11 and the first exposed portion 40a of the second switching element unit 12 are connected to each other with the connection bus bar 90 disposed to extend in the first direction X. However, the present disclosure is not limited to this configuration. The output bus bar 40 may be formed in a shape such that the second exposed portion 40b of the first switching element unit 11 and the first exposed portion 40a of the second switching element unit 12 are in contact with each other, so that the second exposed portion 40b of the first switching element unit 11 and the first exposed portion 40a of the second switching element unit 12 may be directly connected to each other.

(5) In the above embodiment, the first distal end 62a defining the distal end of the second part 62, the surface on the second side Z2 of the second joining portion 52b, and the surface on the second side Z2 of the third part 63 are located in the same plane (in the second reference plane S2) parallel to the first reference plane S1. However, the present disclosure is not limited to this configuration. For example, the first distal end 62a may be located in a position different from the positions of the surface on the second side Z2 of the second joining portion 52b and the surface on the second side Z2 of the third part 63, in the third direction Z.

(6) In the above embodiment, the second extending portion 52a of the output bus bar 40 includes the fourth part 64. However, the present disclosure is not limited thereto. The second extending portion 52a may not include the fourth part 64.

(7) In the above embodiment, both the first exposed portion 40a and the second exposed portion 40b are defined by regions of the output bus bar 40 exposed from the molded portion 2 to the second side Z2. However, the present disclosure is not limited to this configuration. The first exposed portion 40a may be defined by a region of the output bus bar 40 exposed from the molded portion 2 to the third side X1, or the first exposed portion 40a may be defined by both a region of the output bus bar 40 exposed from the molded portion 2 to the second side Z2 and a region exposed to the third side X1. Also, the second exposed portion 40b may be defined by a region of the output bus bar 40 exposed from the molded portion 2 to the fourth side X2, or the second exposed portion 40b may be defined by both a region of the output bus bar 40 exposed from the molded portion 2 to the second side Z2 and a region exposed to the fourth side X2.

(8) In the above embodiment, both the third exposed portion 71a and the fourth exposed portion 71b are defined by regions of the first bus bar 71 exposed from the molded portion 2 to the second side Z2. However, the present disclosure is not limited to this configuration. The third exposed portion 71a may be defined by a region of the first bus bar 71 exposed from the molded portion 2 to the fifth side Y1, or the third exposed portion 71a may be defined by both a region of the first bus bar 71 exposed from the molded portion 2 to the second side Z2 and a region exposed to the fifth side Y1. Also, the fourth exposed portion 71b may be defined by a region of the first bus bar 71 exposed from the molded portion 2 to the sixth side Y2, or the fourth exposed portion 71b may be defined by both a region of the first bus bar 71 exposed from the molded portion 2 to the second side Z2 and a region exposed to the sixth side Y2.

(9) In the above embodiment, both the fifth exposed portion 72a and the sixth exposed portion 72b are defined by regions of the second bus bar 72 exposed from the molded portion 2 to the second side Z2. However, the present disclosure is not limited to this configuration. The fifth exposed portion 72a may be defined by a region of the second bus bar 72 exposed from the molded portion 2 to the fifth side Y1, or the fifth exposed portion 72a may be defined by both a region of the second bus bar 72 exposed from the molded portion 2 to the second side Z2 and a region exposed to the fifth side Y1. Also, the sixth exposed portion 72b may be defined by a region of the second bus bar 72 exposed from the molded portion 2 to the sixth side Y2, or the sixth exposed portion 72b may be defined by both a region of the second bus bar 72 exposed from the molded portion 2 to the second side Z2 and a region exposed to the sixth side Y2.

(10) In the above embodiment, the first bus bar 71 is disposed to be exposed from the molded portion 2, on both sides of the plurality of first switching elements 31 in the second direction Y, and the second bus bar 72 is disposed to be exposed from the molded portion 2, on both sides of the plurality of second switching elements 32 in the second direction Y. However, the present disclosure is not limited to this configuration. The first bus bar 71 may be disposed to be exposed from the molded portion 2, only on one side of the plurality of first switching elements 31 in the second direction Y. Also, the second bus bar 72 may be disposed to be exposed from the molded portion 2, only on one side of the plurality of second switching elements 32 in the second direction Y.

(11) In the present embodiment, the first switching element 31 and the second switching element 32 are located in a common reference plane (in the first reference plane S1). However, the present disclosure is not limited to this configuration. The first switching element 31 and the second switching element 32 may be located in different positions from each other in the third direction Z (the direction orthogonal to both the first direction X and the second direction Y). In such a case, unlike the above embodiment, the output bus bar 40 may not include the bent portion 53, and the first joining portion 51b and the second joining portion 52b may be located in the same plane.

(12) In the above embodiment, the first joining portion 51b is disposed to be in contact with the surface on the first side Z1 of the first switching element 31, and the second joining portion 52b is disposed to be in contact with the surface on the second side Z2 of the second switching element 32. However, the present disclosure is not limited to this configuration. The first joining portion 51b may be disposed to be in contact with the surface on the second side Z2 of the first switching element 31, and the second joining portion 52b may be disposed to be in contact with the surface on the first side Z1 of the second switching element 32. Alternatively, the first joining portion 51b may be disposed to be in contact with the surface of the first switching element 31 on the second side Z2, and the second joining portion 52b may be disposed to be in contact with the surface on the second side Z2 of the second switching element 32. Further alternatively, the first joining portion 51b may be disposed to be in contact with the surface on the first side Z1 of the first switching element 31, and the second joining portion 52b may be disposed to be in contact with the surface on the first side Z1 of the second switching element 32. In such a case, unlike the above embodiment, the output bus bar 40 may not include the bent portion 53, and the first joining portion 51b and the second joining portion 52b may be located in the same plane.

(13) In the above embodiment, the switching element unit 10 is a unit integrated with the capacitor 7 by the case 92. However, the present disclosure is not limited to this configuration. The switching element unit 10 and the capacitor 7 may not be integrated. For example, the switching element unit 10 and the capacitor 7 may be accommodated in different cases.

(14) The features disclosed in any of the embodiments described above (including the embodiments described as other embodiments) may be applied in combination with the features disclosed in the other embodiments as long as no inconsistency arises. Regarding other features as well, the embodiments disclosed herein are merely examples in all respects. Accordingly, various modifications may be appropriately made without departing from the scope and spirit of the present disclosure.

Summary of Embodiments

The following provides a summary of the switching element unit and the switching element module described above.

A switching element unit (10) includes: a switching element set (20) that forms an inverter circuit (100); a first bus bar (71) connected to one of a positive electrode (6P) and a negative electrode (6N) of a DC power supply (6); a second bus bar (72) connected to another of the positive electrode (6P) and the negative electrode (6N) of the DC power supply (6); an output bus bar (40) connected to an AC device (MG); and a molded portion (2); wherein the switching element set (20) includes a first switching element (31) connected to the first bus bar (71) and the output bus bar (40), and a second switching element (32) connected to the second bus bar (72) and the output bus bar (40); wherein the first switching element (31) and the second switching element (32) are arranged side by side in a first direction (X); wherein the output bus bar (40) is disposed to extend in the first direction (X) while being in contact with a surface of the first switching element (31) opposite to a surface in contact with the first bus bar (71), and being in contact with a surface of the second switching element (32) opposite to a surface in contact with the second bus bar (72); wherein the first switching element (31) and the second switching element (32) are disposed to be embedded in the molded portion (2); and wherein the output bus bar (40) includes an embedded portion (40c) embedded in the molded portion (2), a first exposed portion (40a) exposed from the molded portion (2) on one side of the switching element set (20) in the first direction (X), and a second exposed portion (40b) exposed from the molded portion (2) on another side of the switching element set (20) in the first direction (X).

When connecting a plurality of switching element units (10) having this configuration in parallel, switching elements included in different switching element units (10) can be electrically connected in parallel to each other by connecting output bus bars (40) included in the different switching element units (10) to each other, first bus bars (71) to each other, and second bus bars (72) to each other. According to the above configuration, the output bus bar (40) includes the exposed portions (40*a*, 40*b*) exposed from the molded portion (2), on both sides of the switching element set (20) in the first direction (X). Accordingly, a plurality of switching element units (10) to be connected are arranged side by side in the same orientation in the first direction (X), thereby making it possible to simplify the electrical connection structure for connecting the output bus bars (40) to each other. Specifically, the first exposed portion (40*a*) of the output bus bar (40) of one switching element unit (10) of two switching element units (10) adjacent in the first direction (X) and the second exposed portion (40*b*) of the output bus bar (40) of the other switching element unit (10) are connected, so that the output bus bars (40) can be connected to each other without interposing any of the switching element sets (20) of the two switching element units (10). This makes it possible to simplify the electrical connection structure for connecting the output bus bars (40) to each other.

When arranging the plurality of switching element units (10) side by side in the first direction (X) and connecting the output bus bars (40) of two adjacent switching element units (10) to each other in the manner described above, the output bus bar (40) of either one of the switching element units (10) is connected to the AC device (MG). Thus, all the output bus bars (40) of the plurality of switching element units (10) can be electrically connected to the AC device (MG). In this case, of the exposed portions (40*a*, 40*b*) of the output bus bar (40) of the switching element unit (10) disposed at the end in the first direction (X), the exposed portion not connected to the output bus bar (40) of another switching element unit (10) adjacent in the first direction (X) is connected to the AC device (MG). Thus, it is possible to provide an electrical connection structure between the switching element unit (10) and the AC device (MG), while avoiding interference with the electrical connection structure for connecting the output bus bars (40) to each other.

As described above, according to the above configuration, when connecting a plurality of switching element units (10) in parallel, it is possible to simplify the electrical connection structure for electrically connecting switching elements included in different switching element units (10) in parallel to each other.

The first switching element (31) and the second switching element (32) may be located in a common reference plane (S1); one side in an orthogonal direction (Z) orthogonal to the reference plane (S1) may be defined as a first side (Z1), and a side opposite to the first side (Z1) in the orthogonal direction (Z) may be defined as a second side (Z2); the output bus bar (40) may include, sequentially from one side in an extending direction of the output bus bar (40), a first extending portion (51*a*), a first joining portion (51*b*) in contact with a surface on the first side (Z1) of the first switching element (31), a second joining portion (52*b*) in contact with a surface on the second side (Z2) of the second switching element (32), and a second extending portion (52*a*); the first extending portion (51*a*) may include a first part (61) extending in the first direction (X) from the first joining portion (51*b*), and a second part (62) extending from an end of the first part (61) on a side opposite to the first joining portion (51*b*) to the second side (Z2); the second extending portion (52*a*) may include a third part (63) extending in the first direction (X) from the second joining portion (52*b*); a region of the second part (62) exposed from the molded portion (2) to the second side (Z2) may define the first exposed portion (40*a*); and a region of the third part (63) exposed from the molded portion (2) to the second side (Z2) may define the second exposed portion (40*b*).

According to this configuration, the output bus bar (40) includes the first joining portion (51*b*) in contact with the surface on the first side (Z1) of the first switching element (31), and the second joining portion (52*b*) in contact with the surface on the second side (Z2) of the second switching element (32) opposite to the first side (Z1). Accordingly, even in the case where the first switching element (31) and the second switching element (32) are located in the common reference plane (S1), the first switching element (31) and the second switching element (32) can be disposed such that the same surfaces face the same side in the orthogonal direction (Z) (for example, the surfaces provided with a control terminal, such as a gate terminal, face the second side (Z2)). Further, according to the above configuration, even in the case where the output bus bar (40) is formed in a shape that allows this arrangement of the first switching element (31) and the second switching element (32), the output bus bar (40) can be formed to have both the first exposed portion (40*a*) and the second exposed portion (40*b*).

In the above configuration in which the region of the second part (62) exposed from the molded portion (2) to the second side (Z2) defines the first exposed portion (40*a*), and the region of the third part (63) exposed from the molded portion (2) to the second side (Z2) defines the second exposed portion (40*b*), a distal end (62*a*) of the second part (62), a surface on the second side (Z2) of the second joining portion (52*b*), and a surface on the second side (Z2) of the third part (63) may be located in a same plane parallel to the reference plane (S1).

According to this configuration, when a molded unit (3) formed by integrating the switching element set (20) and the output bus bar (40) with the molded portion (2) is press-fitted and fixed to a fixing portion (93) from the second side (Z2), the distal end (62*a*) of the second part (62), the surface on the second side (Z2) of the second joining portion (52*b*), and the surface on the second side (Z2) of the third part (63) serve as pressed portions that are pressed to the first side (Z1) by a jig or the like. Further, according to the above configuration, since these three pressed portions are located in the same plane, it is easy to apply a load uniformly to these three pressed portions and appropriately press-fit the molded unit (3) to the fixing portion (93).

Further, the second extending portion (52*a*) may include a fourth part (64) extending from an end of the third part (63) on a side opposite to the second joining portion (52*b*) to the first side (Z1), and a distal end (64*a*) of the fourth part (64), a surface on the first side (Z1) of the first joining portion (51*b*), and a surface on the first side (Z1) of the first part (61) may be located in a same plane parallel to the reference plane (S1).

According to this configuration, in the case where a surface on the first side (Z1) of the molded unit (3) formed by integrating the switching element set (20) and the output bus bar (40) with the molded portion (2) is a cooled surface (3*a*) that is cooled by the cooling device, not only the surface on the first side (Z1) of the first joining portion (51*b*) and the surface on the first side (Z1) of the first part (61), but also the distal end (64*a*) of the fourth part (64) can be disposed close to the cooling device (for example, disposed to face the cooling device). This makes it possible to efficiently cool the output bus bar (40). Further, according to the above configuration, when the molded unit (3) is press-fitted and fixed to the fixing portion (93) from the second side (Z2), a pressing load applied to the molded unit 3 in the press-fitting and fixing step can be received by the distal end (64a) of the fourth part (64), the surface on the first side (Z1) of the first joining portion (51b), and the surface on the first side (Z1) of the first part (61). This makes it possible to appropriately protect the switching element set (20) while reducing the pressing load applied to the switching element set (20) in the press-fitting and fixing step.

In the switching element unit (10) of each of the above configurations, the switching element set (20) may be provided in plurality, and the output bus bar (40) may be provided in plurality to correspond to the plurality of switching element sets (20); plural of the first switching elements (31) may be arranged side by side in a second direction (Y) crossing the first direction (X); plural of the second switching elements (32) may be arranged side by side in the second direction (Y); and the plurality of output bus bars (40) may be arranged side by side in the second direction (Y) in accordance with an arrangement of the plurality of switching element sets (20).

According to this configuration, even when the switching element unit (10) includes a plurality of switching element sets (20) (for example, equal in number to the number of phases of the inverter circuit (100)), a plurality of switching element units (10) to be connected are arranged side by side in the same orientation in the first direction (X), and the output bus bars (40) disposed in the same position in the second direction (Y) in two adjacent switching element units (10) are connected to each other, thereby making it possible to simplify the electrical connection structure for connecting the output bus bars (40) to each other. Specifically, the first exposed portion (40a) of the output bus bar (40) in one switching element unit (10) of two switching element units (10) adjacent in the first direction (X) and the second exposed portion (40b) of the output bus bar (40) disposed in the same position in the second direction (Y) in the other switching element unit (10) are connected, so that the output bus bars (40) can be connected to each other without interposing any of the switching element sets (20) of the two switching element units (10), and without interposing an electrical connection structure for connecting other output bus bars (40) to each other. This makes it possible to simplify the electrical connection structure for connecting the output bus bars (40) to each other.

In the above configuration in which plural of the first switching elements (31) are arranged side by side in the second direction (Y), and plural of the second switching elements (32) are arranged side by side in the second direction (Y), the first bus bar (71) and the second bus bar (72) may be disposed to extend in the second direction (Y); the first bus bar (71) may be disposed to be exposed from the molded portion (2), on both sides of the plurality of first switching elements (31) in the second direction (Y); and the second bus bar (72) may be disposed to be exposed from the molded portion (2), on both sides of the plurality of second switching elements (32) in the second direction (Y).

According to this configuration, when a plurality of switching element units (10) to be connected are arranged side by side not only in the first direction (X) but also in the second direction (Y), it is possible to simplify the electrical connection structure for connecting first bus bars (71) of two switching element units (10) adjacent in the second direction (Y) to each other and the electrical connection structure for connecting second bus bars (72) thereof to each other. Also, when connecting the first bus bar (71) and the second bus bar (72) to a capacitor (7), the first bus bar (71) and the second bus bar (72) can be connected to the capacitor (7) on both sides in the second direction (Y). Therefore, the effective wiring length between the switching element set (20) and the capacitor (7) is reduced, making it easy to reduce the inductance.

A switching element module (1) may include: plural of the switching element units (10); wherein the plurality of switching element units (10) may include a first switching element unit (11) and a second switching element unit (12) arranged side by side in the first direction (X); wherein a side of the switching element set (20) on which the first exposed portion (40a) is disposed in the first direction (X) may be defined as a third side (X1); wherein the first switching element unit (11) may be disposed on the third side (X1) of the second switching element unit (12) in the first direction (X); and wherein the second exposed portion (40b) of the first switching element unit (11) and the first exposed portion (40a) of the second switching element unit (12) may be connected to each other with a connection bus bar (90) disposed to extend in the first direction (X).

According to this configuration, the first exposed portion (40a) and the second exposed portion (40b) can be connected to each other with the connection bus bar (90), without interposing any of the switching element sets (20) of the first switching element unit (11) and the second switching element unit (12). This makes it possible to simplify the electrical connection structure for connecting the output bus bars (40) of the first switching element unit (11) and the second switching element unit (12) to each other. Further, according to the above configuration, compared to the case where the first exposed portion (40a) and the second exposed portion (40b) are directly connected, the area of the first exposed portion (40a) and the second exposed portion (40b) exposed from the molded portion (2) can be reduced. This makes it possible to reduce the installation space in the case where the first switching element unit (11) and the second switching element unit (12) are used alone.

Each of the first switching element unit (11) and the second switching element unit (12) may be a unit that is integrated with a capacitor (7) electrically connected in parallel to a series circuit of the first switching element (31) and the second switching element (32) included in the switching element set (20).

According to this configuration, when the first switching element unit (11) and the second switching element unit (12) are connected in parallel, the capacity of the entire switching element module (1) including the capacity of the capacitor (7) can be increased. Accordingly, compared to the case where the capacitor (7) is not integrated with the switching element unit (10), it is possible to simplify the design work and the actual work for connecting a plurality of switching element units (10) to each other.

The switching element unit and the switching element module according to the present disclosure only need to provide at least one of the above effects.

DESCRIPTION OF THE REFERENCE NUMERALS 1 switching element module
2 molded portion
6 DC power supply
6P positive electrode
6N negative electrode
7 capacitor 10 switching element unit
11 first switching element unit
12 second switching element unit
20 switching element set
31 first switching element
32 second switching element
40 output bus bar
40a first exposed portion
40b second exposed portion
40c embedded portion
51a first extending portion
51b first joining portion
52a second extending portion
52b second joining portion
61 first part
62 second part
62a first distal end (distal end of second part)
63 third part
64 fourth part
64a second distal end (distal end of fourth part)
71 first bus bar
72 second bus bar
90 connection bus bar
100 inverter circuit
MG rotary electric machine (AC device)
S1 first reference plane (reference plane)
X first direction
X1 third side
Y second direction
Z third direction (orthogonal direction)
Z1 first side
Z2 second side

The invention claimed is:

1. A switching element unit comprising:
a switching element set that forms an inverter circuit;
a first bus bar connected to one of a positive electrode and a negative electrode of a DC power supply;
a second bus bar connected to another of the positive electrode and the negative electrode of the DC power supply;
an output bus bar connected to an AC device; and
a molded portion;
wherein the switching element set includes a first switching element connected to the first bus bar and the output bus bar, and a second switching element connected to the second bus bar and the output bus bar;
wherein the first switching element and the second switching element are arranged side by side in a first direction;
wherein the output bus bar is disposed to extend in the first direction while being in contact with a surface of the first switching element opposite to a surface in contact with the first bus bar, and being in contact with a surface of the second switching element opposite to a surface in contact with the second bus bar;
wherein the first switching element and the second switching element are disposed to be embedded in the molded portion; and
wherein the output bus bar includes an embedded portion embedded in the molded portion, a first exposed portion that protrudes away from the molded portion on one side of the switching element set in the first direction, and a second exposed portion that protrudes away from the molded portion on another side of the switching element set in the first direction.

2. The switching element unit according to claim 1,
wherein the first switching element and the second switching element are located in a common reference plane;
wherein one side in an orthogonal direction orthogonal to the reference plane is defined as a first side, and a side opposite to the first side in the orthogonal direction is defined as a second side;
wherein the output bus bar includes, sequentially from one side in an extending direction of the output bus bar, a first extending portion, a first joining portion in contact with a surface on the first side of the first switching element, a second joining portion in contact with a surface on the second side of the second switching element, and a second extending portion;
wherein the first extending portion includes a first part extending in the first direction from the first joining portion, and a second part extending from an end of the first part on a side opposite to the first joining portion to the second side;
wherein the second extending portion includes a third part extending in the first direction from the second joining portion;
wherein a region of the second part exposed from the molded portion to the second side defines the first exposed portion; and
wherein a region of the third part exposed from the molded portion to the second side defines the second exposed portion.

3. The switching element unit according to claim 2, wherein a distal end of the second part, a surface on the second side of the second joining portion, and a surface on the second side of the third part are located in a same plane parallel to the reference plane.

4. The switching element unit according to claim 2,
wherein the second extending portion includes a fourth part extending from an end of the third part on a side opposite to the second joining portion to the first side; and
wherein a distal end of the fourth part, a surface on the first side of the first joining portion, and a surface on the first side of the first part are located in a same plane parallel to the reference plane.

5. The switching element unit according to claim 1,
wherein the switching element set is provided in plurality, and the output bus bar is provided in plurality to correspond to the plurality of switching element sets;
wherein the plurality of the first switching elements are arranged side by side in a second direction crossing the first direction;
wherein the plurality of the second switching elements are arranged side by side in the second direction; and
wherein the plurality of output bus bars are arranged side by side in the second direction in accordance with an arrangement of the plurality of switching element sets.

6. The switching element unit according to claim 5,
wherein the first bus bar and the second bus bar are disposed to extend in the second direction;
wherein the first bus bar is disposed to be exposed from the molded portion, on both sides of the plurality of first switching elements in the second direction; and
wherein the second bus bar is disposed to be exposed from the molded portion, on both sides of the plurality of second switching elements in the second direction.

7. A switching element module comprising:
a plurality of the switching element units of claim 1;

wherein the plurality of switching element units include a first switching element unit and a second switching element unit arranged side by side in the first direction;

wherein a side of the switching element set on which the first exposed portion is disposed in the first direction is defined as a third side;

wherein the first switching element unit is disposed on the third side of the second switching element unit in the first direction; and wherein the second exposed portion of the first switching element unit and the first exposed portion of the second switching element unit are connected to each other with a connection bus bar disposed to extend in the first direction.

8. The switching element module according to claim 7, wherein each of the first switching element unit and the second switching element unit is a unit that is integrated with a capacitor electrically connected in parallel to a series circuit of the first switching element and the second switching element included in the switching element set.

* * * * *